(12) United States Patent
Chyan et al.

(10) Patent No.: US 10,510,379 B1
(45) Date of Patent: Dec. 17, 2019

(54) METHOD FOR CONTROLLING OPERATIONS OF MEMORY DEVICE, ASSOCIATED MEMORY DEVICE AND CONTROLLER THEREOF, AND ASSOCIATED ELECTRONIC DEVICE

(71) Applicant: Silicon Motion Inc., Hsinchu County (TW)

(72) Inventors: Yu-Wei Chyan, Hsinchu (TW); Li-Shuo Hsiao, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/540,065

(22) Filed: Aug. 14, 2019

Related U.S. Application Data

(63) Continuation of application No. 15/992,160, filed on May 29, 2018.

(30) Foreign Application Priority Data

Nov. 13, 2017 (TW) .............................. 106139197 A

(51) Int. Cl.
| | | |
|---|---|---|
| *G11C 5/14* | (2006.01) | |
| *G06F 1/3225* | (2019.01) | |
| *G11C 16/24* | (2006.01) | |
| *G11C 16/08* | (2006.01) | |
| *G11C 29/04* | (2006.01) | |

(52) U.S. Cl.
CPC ............ *G11C 5/147* (2013.01); *G06F 1/3225* (2013.01); *G11C 16/08* (2013.01); *G11C 16/24* (2013.01); *G11C 2029/0401* (2013.01)

(58) Field of Classification Search
CPC ......... G11C 5/147; G11C 16/24; G11C 16/08; G11C 2029/0401; G06F 1/3225
USPC .................................................... 365/189.09
See application file for complete search history.

(56) References Cited

U.S. PATENT DOCUMENTS

| | | | | |
|---|---|---|---|---|
| 6,906,531 | B2 * | 6/2005 | Mobley | H04L 25/063 |
| | | | | 324/613 |
| 9,170,937 | B2 * | 10/2015 | Hsiao | G06F 12/0246 |
| 9,330,734 | B2 * | 5/2016 | Mozak | G11C 5/147 |
| 2013/0265807 | A1 | 10/2013 | Lee | |
| 2014/0347130 | A1 | 11/2014 | Iijima | |
| 2015/0262694 | A1 | 9/2015 | Seo | |

(Continued)

FOREIGN PATENT DOCUMENTS

TW 200835123 8/2008

*Primary Examiner* — Viet Q Nguyen
(74) *Attorney, Agent, or Firm* — Winston Hsu

(57) ABSTRACT

A method for controlling operations of a memory device, the memory device and the controller thereof, and the associated electronic device are provided. The method can comprise: before a voltage-drop event regarding a driving voltage occurs, mapping a rising reference voltage and a falling reference voltage to a first reference voltage and a second reference voltage, respectively; when the voltage-drop event occurs, pausing at least one access operation to a non-volatile (NV) memory, and mapping the rising reference voltage and the falling reference voltage to another first reference voltage and another second reference voltage, respectively; and when the voltage-drop event ends, mapping the rising reference voltage and the falling reference voltage to the first reference voltage and the second reference voltage, respectively.

19 Claims, 6 Drawing Sheets

(56) References Cited

U.S. PATENT DOCUMENTS

| | | |
|---|---|---|
| 2017/0169788 A1 | 6/2017 | Kim |
| 2018/0210478 A1* | 7/2018 | Yi .......................... G05F 1/575 |
| 2019/0147920 A1* | 5/2019 | Chyan .................... G11C 5/147 |
| | | 365/189.09 |

* cited by examiner

US 10,510,379 B1

METHOD FOR CONTROLLING OPERATIONS OF MEMORY DEVICE, ASSOCIATED MEMORY DEVICE AND CONTROLLER THEREOF, AND ASSOCIATED ELECTRONIC DEVICE

CROSS REFERENCE TO RELATED APPLICATIONS

This application is a continuation application and claims the benefit of U.S. Non-provisional application Ser. No. 15/992,160, which was filed on May 29, 2018, and is included herein by reference.

BACKGROUND OF THE INVENTION

1. Field of the Invention

The present invention relates to flash memory access, and more particularly, to a method for controlling the operations of a memory device, and an associated memory device and a controller thereof, and an associated electronic device.

2. Description of the Prior Art

In recent years, due to the continuous development of memory technology, a variety of portable or non-portable memory devices (for example, SD/MMC, CF, MS, XD, or UFS standard memory cards; for another example, solid state disk (SSD); for another example, an embedded storage device conforming to UFS or EMMC specifications) is widely implemented in many applications. Therefore, the access control of memory in these memory devices has become a rather hot topic.

The commonly utilized NAND flash memories mainly comprise single level cell (SLC) and multiple level cell (MLC) flash memories. Each transistor in the SLC flash memory is treated as a memory cell with only two charge values, representing the logic 0 and the logic 1, respectively. In addition, the storage capacity of each transistor in the MLC flash memory, which is treated as a memory cell, is fully utilized by being driven at a higher voltage to record at least two sets of bit information (such as 00, 01, 11, 10) in a transistor through different levels of voltage. Theoretically, the recording density of MLC flash memory can reach at least twice the recording density of SLC flash memory, and is therefore preferred by manufacturers of NAND flash memories who have encountered the bottleneck in the development process.

The lower cost and larger capacity of the MLC flash memory means it is more likely to be applied in portable memory devices than an SLC flash memory. However, the MLC flash memory does have instability issues. In order to ensure that the memory device can control access to the flash memory in compliance with the relevant specifications, the flash memory controller usually has some management mechanism to properly manage data access.

According to the related art, the memory devices having these management mechanisms still have some disadvantages. For example, when the voltage level of the power supply is unstable, it is possible to cause the memory device to malfunction. Since the reference voltage provided by the analog intellectual property module (analog IP module) in the memory device might have large error, the memory device might erroneously determine that the above voltage level is too low and therefore perform erroneous control, so that the memory device crashes. Therefore, there is a requirement for a novel method and associated architecture to enhance the performance of a memory device without side effects or with less likely side effects.

SUMMARY OF THE INVENTION

It is therefore one of the objectives of the present invention to provide a method for controlling the operations of a memory device and an associated memory device and a controller thereof to solve the above problems.

It is another object of the present invention to provide a method for controlling the operations of a memory device and an associated memory device and a controller thereof to achieve the optimal performance of the memory device without side effects or in a way that is less likely to cause the side effects.

According to a first aspect of the present invention, a method for controlling operations of a memory device is provided, wherein the memory device comprises a non-volatile (NV) memory, and the NV memory comprises at least one NV memory element. The method can comprise: before a voltage-drop event regarding a driving voltage occurs, respectively mapping a rising reference voltage and a falling reference voltage to a first reference voltage and a second reference voltage generated by a reference voltage generating circuit in the memory device, to respectively select the first reference voltage and the second reference voltage as the rising reference voltage and the falling reference voltage, wherein the memory device retrieves the driving voltage from a host device, the reference voltage generating circuit generates at least one portion of a plurality of candidate reference voltages, the at least one portion of the plurality of candidate reference voltages comprises the first reference voltage and the second reference voltage, and the first reference voltage is greater than the second reference voltage; using a voltage detector in the memory device to monitor the driving voltage according to the second reference voltage selected as the falling reference voltage, to determine whether the voltage-drop event occurs; when the voltage-drop event occurs, pausing at least one access operation to the NV memory, and respectively mapping the rising reference voltage and the falling reference voltage to another first reference voltage and another second reference voltage generated by the reference voltage generating circuit, to respectively select the another first reference voltage and the another second reference voltage as the rising reference voltage and the falling reference voltage, wherein the at least one portion of the plurality of candidate reference voltages comprises the another first reference voltage and the another second reference voltage, and the another first reference voltage is greater than the another second reference voltage; using the voltage detector to monitor the driving voltage according to the another first reference voltage selected as the rising reference voltage, to determine whether the voltage-drop event ends; and when the voltage-drop event ends, respectively mapping the rising reference voltage and the falling reference voltage to the first reference voltage and the second reference voltage, to respectively select the first reference voltage and the second reference voltage as the rising reference voltage and the falling reference voltage.

According to a second aspect of the present invention, a memory device is disclosed. The memory device can comprise: a NV memory, arranged to store information, wherein the NV memory comprises at least one NV memory element; and a controller, coupled to the NV memory, arranged to control at least one operations of the memory device, wherein the controller comprises: a processing circuit, arranged to control the controller according to a command from a host device to allow the host device to access the NV memory through the controller, wherein the controller performs the following operations under the control of the processing circuit: before a voltage-drop event regarding a driving voltage occurs, respectively mapping a rising reference voltage and a falling reference voltage to a first reference voltage and a second reference voltage generated by a reference voltage generating circuit in the memory device, to respectively select the first reference voltage and the second reference voltage as the rising reference voltage and the falling reference voltage, wherein the memory device retrieves the driving voltage from a host device, the reference voltage generating circuit generates at least one portion of a plurality of candidate reference voltages, the at least one portion of the plurality of candidate reference voltages comprises the first reference voltage and the second reference voltage, and the first reference voltage is greater than the second reference voltage; using a voltage detector in the memory device to monitor the driving voltage according to the second reference voltage selected as the falling reference voltage, to determine whether the voltage-drop event occurs; when the voltage-drop event occurs, pausing at least one access operation to the NV memory, and respectively mapping the rising reference voltage and the falling reference voltage to another first reference voltage and another second reference voltage generated by the reference voltage generating circuit, to respectively select the another first reference voltage and the another second reference voltage as the rising reference voltage and the falling reference voltage, wherein the at least one portion of the plurality of candidate reference voltages comprises the another first reference voltage and the another second reference voltage, and the another first reference voltage is greater than the another second reference voltage; using the voltage detector to monitor the driving voltage according to the another first reference voltage selected as the rising reference voltage, to determine whether the voltage-drop event ends; and when the voltage-drop event ends, respectively mapping the rising reference voltage and the falling reference voltage to the first reference voltage and the second reference voltage, to respectively select the first reference voltage and the second reference voltage as the rising reference voltage and the falling reference voltage.

According to some embodiments, the present invention further provides an electronic device, which comprises the above-mentioned memory device and further comprises the host device. The host device is coupled to the memory device and comprises at least one processor arranged to control operations of the host device. In addition, the memory device is operable to provide storage space to the host device.

According to a third aspect of the present invention, a controller of a memory device is disclosed, wherein the memory device comprises the controller and a NV memory, and the NV memory comprises at least one NV memory element. The controller can comprise: a processing circuit, arranged to control the controller according to a command from a host device to allow the host device to access the NV memory through the controller, wherein the controller performs the following operations under the control of the processing circuit: before a voltage-drop event regarding a driving voltage occurs, respectively mapping a rising reference voltage and a falling reference voltage to a first reference voltage and a second reference voltage generated by a reference voltage generating circuit in the memory device, to respectively select the first reference voltage and the second reference voltage as the rising reference voltage and the falling reference voltage, wherein the memory device retrieves the driving voltage from a host device, the reference voltage generating circuit generates at least one portion of a plurality of candidate reference voltages, the at least one portion of the plurality of candidate reference voltages comprises the first reference voltage and the second reference voltage, and the first reference voltage is greater than the second reference voltage; using a voltage detector in the memory device to monitor the driving voltage according to the second reference voltage selected as the falling reference voltage, to determine whether the voltage-drop event occurs; when the voltage-drop event occurs, pausing at least one access operation to the NV memory, and respectively mapping the rising reference voltage and the falling reference voltage to another first reference voltage and another second reference voltage generated by the reference voltage generating circuit, to respectively select the another first reference voltage and the another second reference voltage as the rising reference voltage and the falling reference voltage, wherein the at least one portion of the plurality of candidate reference voltages comprises the another first reference voltage and the another second reference voltage, and the another first reference voltage is greater than the another second reference voltage; using the voltage detector to monitor the driving voltage according to the another first reference voltage selected as the rising reference voltage, to determine whether the voltage-drop event ends; and when the voltage-drop event ends, respectively mapping the rising reference voltage and the falling reference voltage to the first reference voltage and the second reference voltage, to respectively select the first reference voltage and the second reference voltage as the rising reference voltage and the falling reference voltage.

One of the advantages of the present invention is that the present invention can properly control the operations of the memory device to prevent the errors in the reference voltage provided by the analog intellectual property module (analog IP module) in the memory device from causing the memory device crash. In addition, almost no additional cost is required for the implementation of the embodiments of the present invention. Therefore, the problems of the associated art can be solved without increasing the overall cost much. In contrast to the associated art, the present invention can achieve the optimal performance of a memory device without side effects or in a way that is less likely to cause side effects.

These and other objectives of the present invention will no doubt become obvious to those of ordinary skill in the art after reading the following detailed description of the preferred embodiment that is illustrated in the various figures and drawings.

DETAILED DESCRIPTION

I. Memory System

Figure 1:
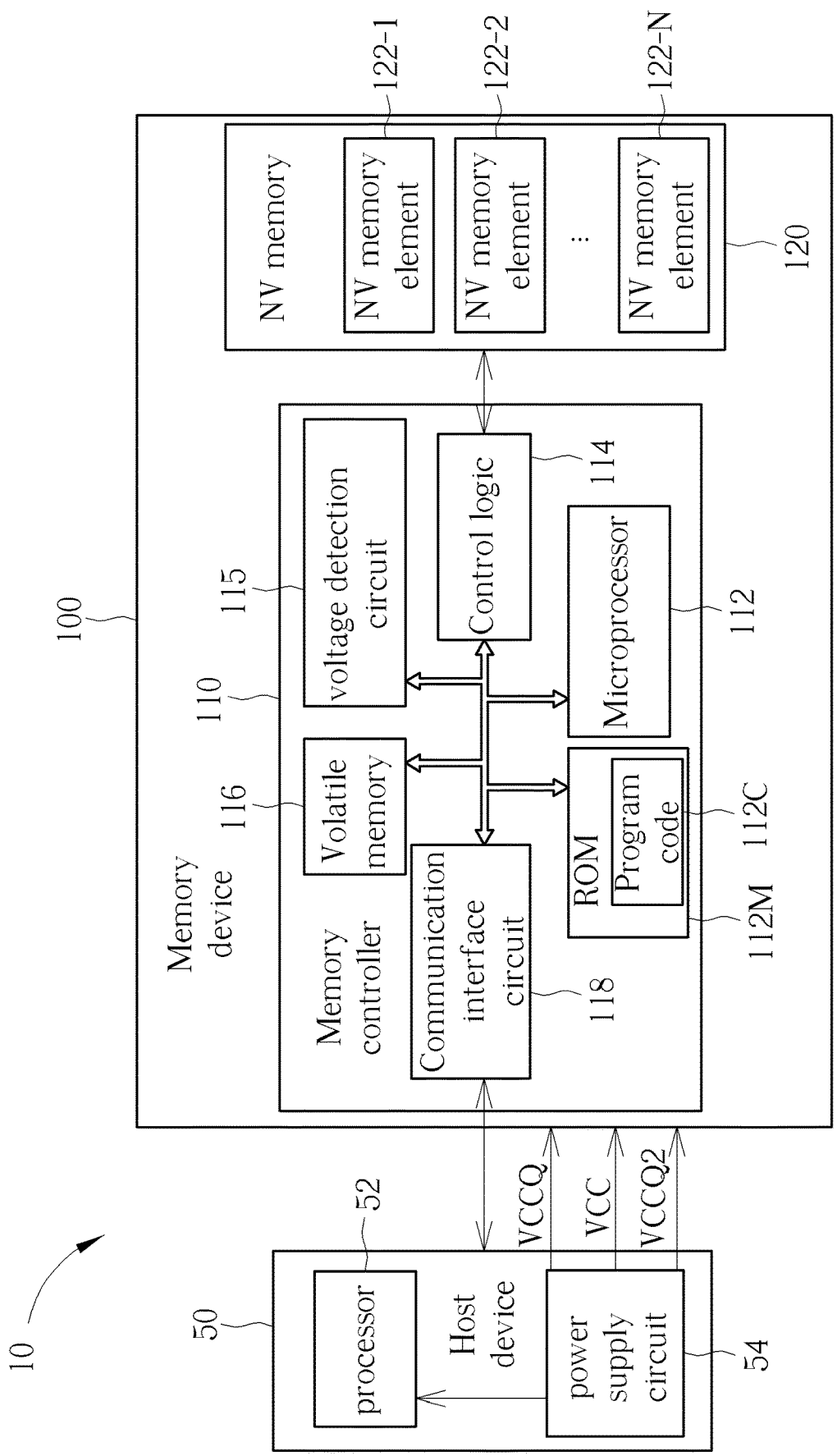
FIG. 1 is a schematic diagram of an electronic device according to an embodiment of the present invention.

Please refer to FIG. 1. FIG. 1 is a schematic diagram of an electronic device 10 according to an embodiment of the present invention. The electronic device 10 comprises a host device 50 and a memory device 100. The host device 50 can comprise: at least one processor 52 (such as one or more processors) arranged to control the operations of the host device 50; and a power supply circuit 54, coupled to the at least one processor 52, arranged to provide power to the at least one processor 52 and the memory device 100, and provide a set of driving voltages {VCC, VCCQ, VCCQ2} to the memory device 100, wherein the memory device 100 can be arranged to provide storage space to the host device 50, and acquire the driving voltage {VCC, VCCQ, VCCQ2} from the host device 50 as the power source of the memory device 100. Examples of the host device 50 can comprise (but are not limited to) a multifunctional mobile phone, a tablet, a wearable device, and a personal computer such as a desktop computer and a laptop. An example of the memory device 100 can be a portable memory device (for example, a memory card conforming to the SD/MMC, CF, MS, or XD standard), a solid state drive (SSD), and various embedded storage devices (such as embedded storage devices conforming to the UFS or the EMMC specifications). According to this embodiment, the memory device 100 can comprise a controller such as the memory controller 110, and can further comprise a NV memory 120, wherein the controller is arranged to access the NV memory 120, and the NV memory 120 is arranged to store information. The NV memory 120 can comprise at least one NV memory element (for example, one or more NV memory elements), such a plurality of NV memory elements 122-1, 122-2, ... and 122-N, wherein the symbol "N" can represent a positive integer greater than one. For example, the NV memory 120 can be a flash memory, and the NV memory elements 122-1, 122-2, ... and 122-N can respectively be a plurality of flash memory chips or a plurality of flash memory dies, but the present invention is not limited thereto.

As shown in FIG. 1, the memory controller 110 can comprise a processing circuit such as a microprocessor 112, a memory such as a read only memory (ROM) 112M, a control logic circuit 114, a volatile memory 116, and transmission interface circuit 118, wherein these components can be coupled to one another via a bus. The volatile memory 116 is implemented with a random access memory (RAM), for example, a static RAM (SRAM), and the voltage detection circuit 115 can comprise one or more analog intellectual property modules (analog IP modules), but the present invention is not limited thereto. The volatile memory 116 can be arranged to provide the internal storage space for the memory controller 110, for example, to temporarily store the data, and the voltage detection circuit 115 can be utilized for voltage detection. For example, the voltage detection circuit 115 can be arranged to perform the voltage detection according to one or more threshold values determined by the microprocessor 112.

In addition, the ROM 112M of this embodiment is arranged to store a program code 112C, and the microprocessor 112 is arranged to execute the program code 112C in order to control access of the NV memory 120. Please note that the program code 112C can also be stored in the volatile memory 116 or in any type of memory. In addition, the control logic circuit 114 can comprise an error correction code (ECC) circuit (not shown) for protecting data and/or performing error correction, and the transmission interface circuit 118 can conform to a specific communications specification (for example, the serial advanced technology attachment (SATA) specification, the universal serial bus (USB) specification, the peripheral component interconnect express (PCIE) specification), the embedded Multi Media Card (eMMC) specification, or the Universal Flash Storage (UFS) specification) and can perform the communications according to this specific communications specification.

In this embodiment, the host device 50 can indirectly access the memory device 100 by sending a plurality of host device commands and corresponding logical addresses to the memory controller 110 Body 120. The memory controller 110 receives the plurality of host device commands and the logical address, and respectively translates the plurality of host device commands into memory operations commands (referred to as operations commands for short), and then controls the NV memory 120 to perform reading, writing/programming, or erasing on memory units or pages having a specific physical address within the NV memory 120, wherein the physical address corresponds to a logical address.

According to some embodiments, the architecture shown in FIG. 1 can have variations. For example, the voltage detection circuit 115 can be integrated into the microprocessor 110, but the present invention is not limited thereto.

II. Reference Voltage Dynamic Mapping Architecture

The memory controller 110 can receive a plurality of host device commands from the host device 50 and execute the plurality of host device commands, and return the operations results to the host device 50. In particular, the microprocessor 112 can control the memory controller 110 in accordance with a command (for example, any one of the plurality of host device commands) from the host device 50, so as to allow the host device 50 to access the NV memory 120 through the memory controller 110. While the memory controller 110 is controlling the memory device 100, the voltage level of one or more driving voltages of the set of driving voltages {VCC, VCCQ, VCCQ2} from the host device 50 may be not stable, for example, some factors can cause a certain driving voltage (such as any driving voltage of the set of driving voltages {VCC, VCCQ, VCCQ2}) to become lower, which can be regarded as a voltage-drop event. With the reference voltage dynamic mapping architecture (such as the reference voltage dynamic mapping architecture 210 shown in FIG. 2) of the present invention, the controller can properly control the operations of the memory device 100 to prevent the errors in the reference voltage provided by the above analog intellectual property module (analog IP module) in the memory device from causing the memory device crash, and improves the overall performance of the memory device 100.

Figure 2:
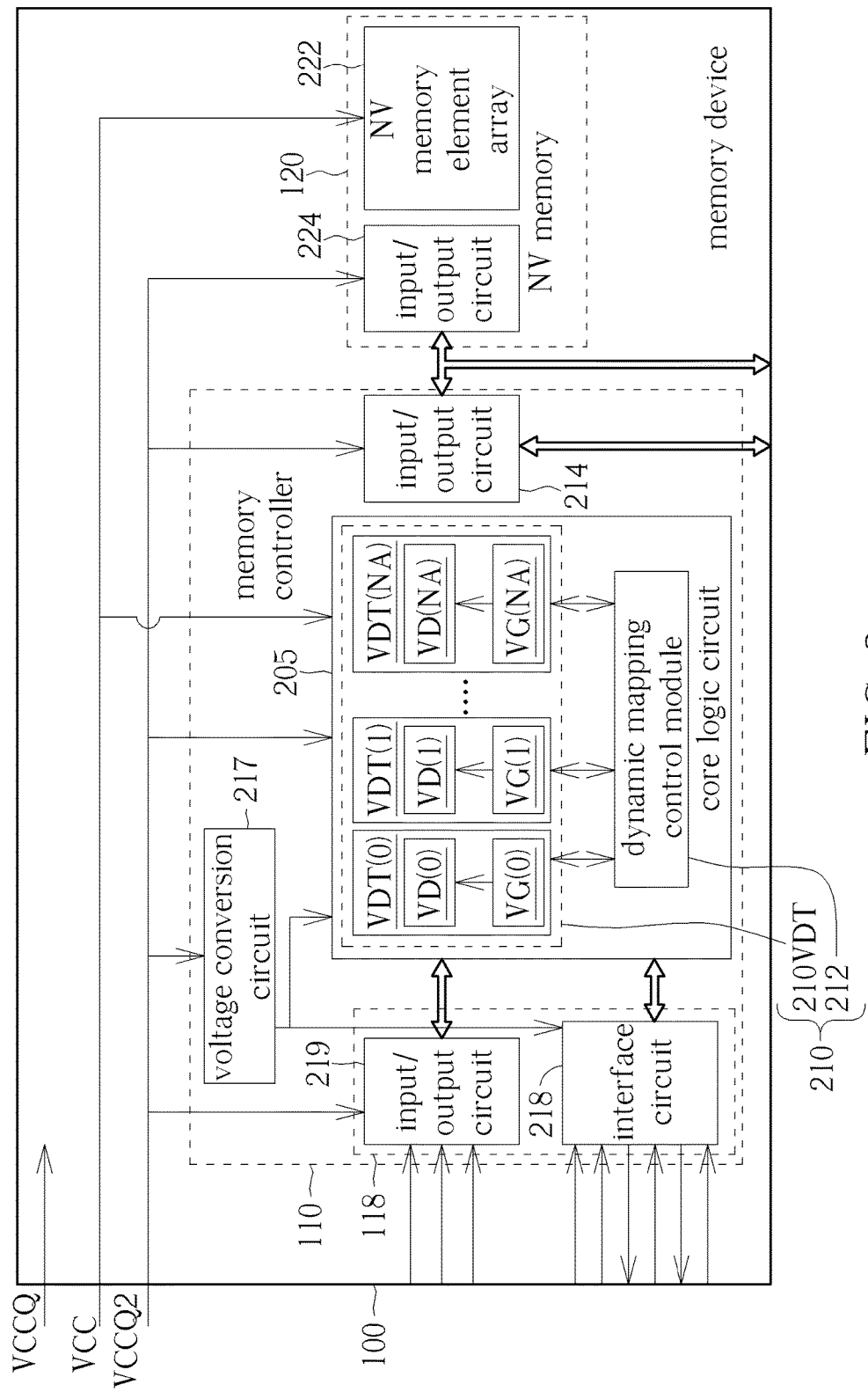
FIG. 2 shows the implementation details of the memory device shown in FIG. 1 according to an embodiment of the present invention.

FIG. 2 shows the implementation details of the memory device 100 shown in FIG. 1 according to an embodiment of the present invention. The NV memory 120 can comprise a NV memory element array 222 and an input/output circuit 224. The NV memory element array 222 can comprise a NV memory element {122-1, 122-2, ..., 122-N} shown in FIG. 1. In addition, the core logic circuit 205 can be an example of the microprocessor 110, and the input/output circuit 214 can be an example of a control logic circuit. The transmission interface circuit 118 can comprise an interface circuit 218 and an input/output circuit 219, and the memory controller 110 can comprise a voltage conversion circuit 217. For example, the voltage levels of the driving voltages {VCC, VCCQ, VCCQ2} can be {3.3, 1.2, 1.8} volt (V), respectively, but the invention is not limited thereto. In some examples, the host device 50 can be designed by its manufacturer to output slightly different voltage levels for power saving, wherein the voltage levels of the driving voltages {VCC, VCCQ, VCCQ2} can be {3.3, 1.2, 1.7} volts. As shown in FIG. 2, the reference voltage dynamic mapping architecture 210 in the core logic circuit 205 can comprise a voltage detection circuit 210VDT, which can be utilized as an example of the voltage detection circuit 115, wherein the voltage detection circuit 210VDT of the present embodiment can be embedded in the microprocessor 110 such as the core logic circuit 205, but the present invention is not limited thereto. The voltage detection circuit 210VDT can comprise a set of configurable voltage-monitoring circuits {VDT(0), VDT(1), . . . , VDT(NA)}, which can serve as an example of one or more of the above analog IP modules, wherein the symbol "NA" can represent a positive integer. For example, the configurable voltage monitoring circuit VDT(0) can comprise a voltage detector VD(0) and a reference voltage generating circuit VG(0); a configurable voltage monitoring circuit VDT(1) can comprise a voltage detector VD(1) and a reference voltage generating circuit VG(1); and so on. For another example, the configurable voltage monitoring circuit VDT(NA) can comprise a voltage detector VD(NA) and a reference voltage generating circuit VG(NA). In addition, the reference voltage dynamic mapping architecture 210 can further comprise a dynamic mapping control module 212. For example, the dynamic mapping control module 212 can be a program module executed on the microprocessor 110 (such as the core logic circuit 205). In this case, the microprocessor 110 (such as the core logic circuit 205) hat executes the dynamic mapping control module 212 can be considered as a dynamic mapping control circuit. For another example, the dynamic mapping control module 212 can be a sub-circuit of the microprocessor 110 such as the core logic circuit 205. In this case, the dynamic mapping control module 212 can be regarded as a dynamic mapping control circuit.

According to the present embodiment, for any monitor circuit VDT(na) (the symbol "na" represents an integer in the interval [0, NA]) of the set of configurable monitor circuits {VDT(0), VDT(1), . . . , VDT(NA)}, the dynamic mapping control module 212 can dynamically determine or select a set of threshold values, such as a rising reference voltage VRR and a falling reference voltage VFR, and can control the configurable monitoring circuit VDT(na) to detect voltage of a target signal (such as any one of the driving voltages {VCC, VCCQ, VCCQ2}) according to the set of threshold values. For example, the rising reference voltage VRR and the falling reference voltage VFR can represent a set of reference voltages output from the reference voltage generating circuit VG(na) to the voltage detector VD(na) for use of the voltage detector VD(na) (for example, detect the voltage level of the target signal through comparing the target signal with a certain reference voltage of the set of reference voltages). Since the dynamic mapping control module 212 can dynamically change the set of threshold values, the memory controller 110 can accurately control the operations of the memory device 100 without being affected by certain errors (such as the error of the reference voltage).

TABLE 1

| VDT1_S[3:0], VDT2_S[3:0] | VRR | VFR |
| --- | --- | --- |
| 0000 | 1.4002 | 1.3055 |
| 0001 | 1.5117 | 1.4190 |
| 0010 | 1.6117 | 1.5195 |
| 0011 | 1.7051 | 1.6121 |
| 0100 | 1.8138 | 1.7236 |
| 0101 | 1.9062 | 1.8143 |
| 0110 | 2.0065 | 1.9135 |
| 0111 | 2.1001 | 2.0044 |
| 1000 | 2.2083 | 2.1114 |
| 1001 | 2.3043 | 2.2063 |
| 1010 | 2.4027 | 2.3040 |
| 1011 | 2.5002 | 2.4011 |
| 1100 | 2.5999 | 2.5006 |
| 1101 | 2.6982 | 2.5985 |
| 1110 | 2.7977 | 2.6980 |
| 1111 | 2.8903 | 2.7964 |

The Table 1 shows an example of the relationship between the set of threshold values and the digital control values, in which the two columns of the right side respectively indicate the respective candidate reference voltages {1.4002, 1.5117, . . . , 2.8903} and {1.3055, 1.4190, . . . , 2.7964} (their ideal values can be {1.4, 1.5, . . . , 2.9} and {1.3, 1.4, . . . , 2.8}, respectively, under the condition of no error) of the rising reference voltage VRR and the falling reference voltage VFR. The column of the left side indicates the digital control value {0000, 0001, . . . , 1111} of each of the digital control signals VDT1_S and VDT2_S, wherein the symbol "[3: 0]" represents 4 bits of the digital control value, such as 3, 2, 1, and 0 (the number of bits is equal to 4), and the unit of the candidate reference voltage is volt, but the present invention is not limited thereto.

For ease of understanding, it is assumed that the dynamic mapping control module 212 can monitor a specific driving voltage among the driving voltages {VCC, VCCQ, VCCQ2}, such as the driving voltage VCCQ2, by using the configurable monitoring circuit VDT(na), but the present invention is not limited to this. For example, for the configurable monitoring circuit VDT(na), the dynamic mapping control module 212 can set each digital control value of the digital control signals VDT1_S and VDT2_S to a certain value of the column of the left side in the Table 1 (such as the digital control value 0011), wherein the core logic circuit 205 (for example, the voltage detection circuit 210VDT or the reference voltage generation circuit VG(na)) can comprise a control register for setting a digital control value, but the present invention is not limited thereto. The dynamic mapping control module 212 can output the digital control signals VDT1_S and VDT2_S to the configurable monitoring circuit VDT(na), especially the reference voltage generating circuit VG(na) therein. According to the mapping relationship shown in the Table 1, the reference voltage generating circuit VG(na) can generate two candidate reference voltages corresponding to this value (such as the candidate reference voltages {1.7051, 1.6121} corresponding to the digit control value 0011) and output the two candidate reference voltages to the voltage detector VD(na), wherein the reference voltage generation circuit VG(na) can comprise one or more switching circuits (for example, a plurality of switches such as field effect transistors (FET)), which can select a candidate reference voltage according to the digital control value, but the present invention is not limited thereto. Thus, the voltage detector VD(na) can use the two candidate reference voltages (such as the candidate reference voltages {1.7051, 1.6121} corresponding to the digital control value 0011) as the rising reference voltage VRR and the falling reference voltage VFR, respectively.

TABLE 2

| VDT1_S[3:0] | VRR | VDT2_S[3:0] | VFR |
|---|---|---|---|
| 0000 | 1.4002 | 0000 | 1.3055 |
| 0001 | 1.5117 | 0001 | 1.4190 |
| 0010 | 1.6117 | 0010 | 1.5195 |
| 0011 | 1.7051 | 0011 | 1.6121 |
| 0100 | 1.8138 | 0100 | 1.7236 |
| 0101 | 1.9062 | 0101 | 1.8143 |
| 0110 | 2.0065 | 0110 | 1.9135 |
| 0111 | 2.1001 | 0111 | 2.0044 |
| 1000 | 2.2083 | 1000 | 2.1114 |
| 1001 | 2.3043 | 1001 | 2.2063 |
| 1010 | 2.4027 | 1010 | 2.3040 |
| 1011 | 2.5002 | 1011 | 2.4011 |
| 1100 | 2.5999 | 1100 | 2.5006 |
| 1101 | 2.6982 | 1101 | 2.5985 |
| 1110 | 2.7977 | 1110 | 2.6980 |
| 1111 | 2.8903 | 1111 | 2.7964 |

The Table 2 lists the relationship between the rising reference voltage VRR and the digital control value and the relationship between the falling reference voltage VFR and the digital control value. The Table 2 is similar to the Table 1. The left half of the Table 2 indicates that the dynamic mapping control module 212 can independently control the rising reference voltage VRR through the digital control signal VDT1_S. In addition, the right half of the Table 2 indicates that the dynamic mapping control module 212 can control the falling reference voltage VFR independently through the digital control signal VDT2_S.

According to some embodiments, the contents of at least one of the Table 1 and the Table 2 (for example, the Table 1 and/or the Table 2) can be varied. For example, the number of bits of the digital control value of at least one of the digital control signals VDT1_S and VDT2_S (for example, VDT1_S and/or VDT2_S) can increase or decrease. For another example, the range of candidate reference voltages can vary to comprise the possible range of variation of the target signal. For another example: the number of candidate reference voltages can increase or decrease.

According to the reference voltage dynamic mapping architecture 210 shown in FIG. 2, the dynamic mapping control module 212 can respectively use the set of configurable monitoring circuits {VDT(0), VDT(1), . . . , VDT(NA)} to monitor a plurality of target signals (such as the driving voltage {VCC, VCCQ, VCCQ2} and the driving voltage outputted by the voltage converting circuit 217, wherein NA=4), but the present invention is not limited thereto.

III. System Management

Figure 3:
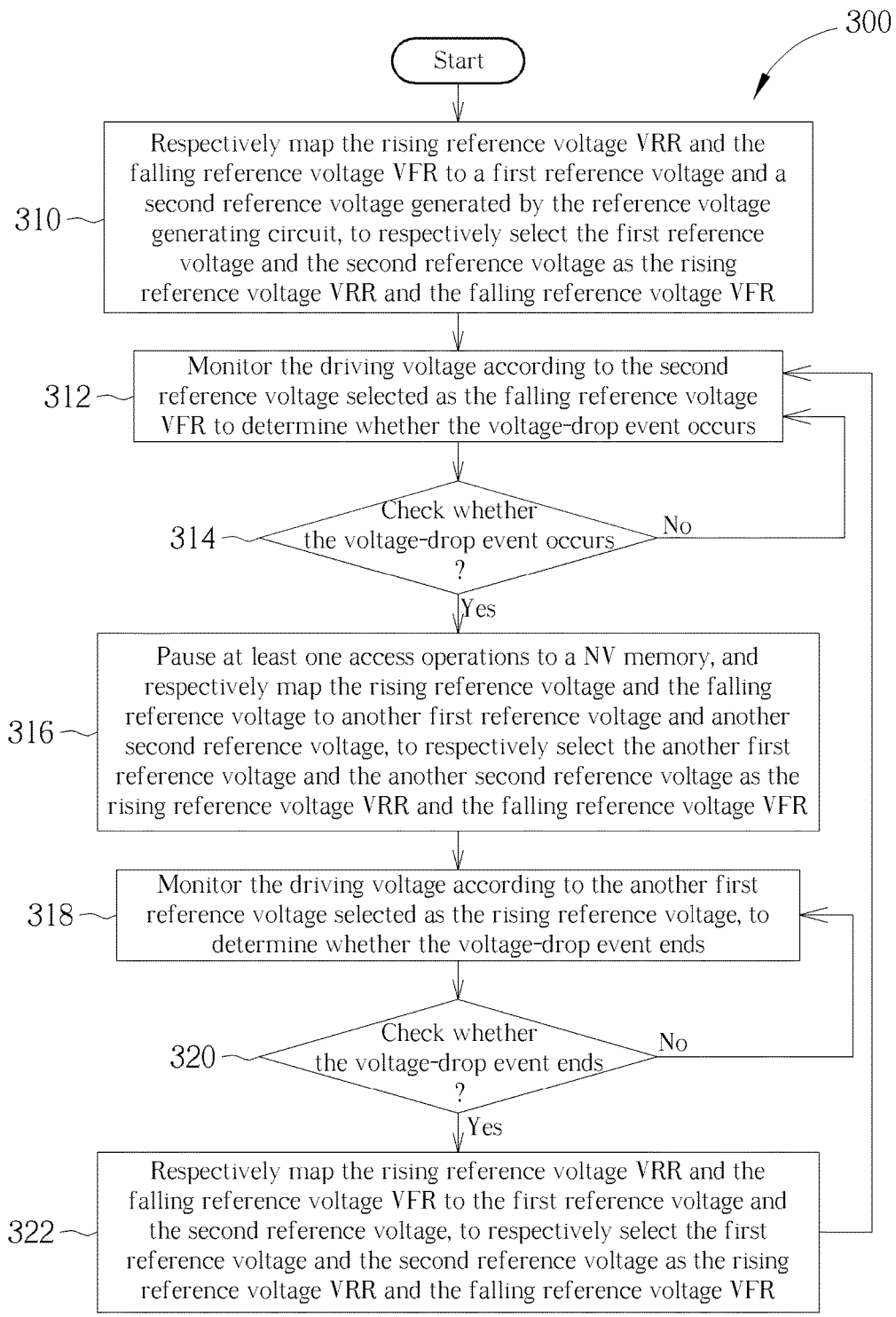
FIG. 3 is a flowchart of a method configured to control the operations of a memory device according to an embodiment of the present invention.

FIG. 3 is a flowchart of a method 300 arranged to control the operations of a memory device according to an embodiment of the present invention. The method 300 can be applied to the electronic device 10 and the memory device 100, and can be applied to the controller such as the memory controller 110, in particular, applicable to the processing circuit such as the microprocessor 112 (for example, the dynamic mapping control module 212 therein). For various conditions, such as a condition before a voltage-drop event of a driving voltage (for example, any one of the driving voltages {VCC, VCCQ, VCCQ2}), a condition at the time of the voltage-drop event, or a condition after the voltage-drop event, the memory controller 110 can dynamically perform the mapping control to accurately control the operations of the memory device 100. For example, the driving voltage can be the driving voltage VCCQ2, and in response to the possible range of the driving voltage VCCQ2, the reference voltages mentioned in some steps can be correspondingly selected from any one of the Table 1 and the Table 2, or a version with larger error, but the present invention is not limited thereto.

In the step 310, before the voltage-drop event occurs, the memory controller 110 can respectively map the rising reference voltage VRR and the falling reference voltage VFR to a first reference voltage and a second reference voltage generated by the reference voltage generating circuit VG(na), such as the candidate reference voltages {1.7051, 1.6121} corresponding to the digital control value 0011 or the candidate reference voltages {1.73, 1.63} corresponding to the digital control value 0011 with a larger error, to respectively select the first reference voltage (such as 1.7051 or 1.73) and the second reference voltage (such as 1.6121 or 1.63) as the rising reference voltage VRR and the falling reference voltage VFR, wherein the reference voltage generating circuit VG(na) generates at least one portion of the plurality of candidate reference voltages, the at least one portion of the plurality of candidate reference voltages comprises the first reference voltage and the second reference voltage, and the first reference voltage is greater than the second reference voltage.

In the step 312, the memory controller 110 can monitor the driving voltage according to the second reference voltage (such as 1.6121 or 1.63) selected as the falling reference voltage VFR by using the voltage detector VD(na) to determine whether the voltage-drop event occurs.

In the step 314, according to at least one detection result of the voltage detector VD(na), the memory controller 110 can check whether the voltage-drop event occurs. For example, a first detection result of the at least one detection result can indicate that the driving voltage is less than the second reference voltage (such as 1.6121 or 1.63) selected as the falling reference voltage VFR. According to the first detection result, the memory controller 110 can determine that the voltage-drop event occurs when the driving voltage is less than the second reference voltage selected as the falling reference voltage VFR. For another example, another detection result of the at least one detection result can indicate that the driving voltage is greater than or equal to the second reference voltage (such as 1.6121 or 1.63) selected as the falling reference voltage VFR, and the memory controller 110 can determine that the voltage-drop event has not occurred in this situation. When the voltage-drop event occurs, go to the step 316; otherwise, go to the step 312.

In the step 316, when the voltage-drop event occurs, the memory controller 110 can pause at least one access operation (such as a reading operation or a writing operation) to the NV memory 120 and respectively map the rising reference voltage VRR and the falling reference voltage VFR to another first reference voltage and another second reference voltage generated by the reference voltage generating circuit VG(na), such as the candidate reference voltage {1.6117, 1.5195} corresponding to the digital control value 0010 or the candidate reference voltage {1.63, 1.53} corresponding to the digital control value 0010 with larger error, to respectively select the another first reference voltage and the another second reference voltage as the rising reference voltage VRR and the falling reference voltage VFR, wherein the at least one portion of the plurality of candidate reference voltages comprises the another first reference voltage (such as 1.6117 or 1.63) and the another second reference voltage (such as 1.5195 or 1.53), and the another first reference voltage is greater than the another second reference voltage. For example, when the voltage-drop event occurs, the memory controller 110 can pause any writing operations to the NV memory 120 until the voltage-drop event ends.

In the step 318, the memory controller 110 can monitor the driving voltage according to the another first reference voltage (such as 1.6117 or 1.63) selected as the rising reference voltage VRR by using the voltage detector VD(na), to determine whether the voltage-drop event ends.

In the step 320, according to at least one detection result of the voltage detector VD(na), the memory controller 110 can check whether the voltage-drop event ends. For example, a second detection result of the at least one detection result can indicate that the driving voltage is greater than the another first reference voltage (such as 1.6117 or 1.63) selected as the rising reference voltage VRR. According to the second detection result, the memory controller 110 can determine that the voltage-drop event ends when the driving voltage is greater than the another first reference voltage selected as the rising reference voltage VRR. For another example, another detection result of the at least one detection result can indicate that the driving voltage is less than or equal to the another first reference voltage (such as 1.6117 or 1.63) selected as the rising reference voltage VRR, and in this situation, the memory controller 110 can determine that the voltage-drop event has not ended yet. When the voltage-drop event ends, go to the step 322; otherwise, go to the step 318.

In the step 322, when the voltage-drop event ends, the memory controller 110 can respectively map the rising reference voltage VRR and the falling reference voltage VFR to the first reference voltage generated by the reference voltage generating circuit VG(na) and the first reference voltage generated by the reference voltage generating circuit VG(na), such as a candidate reference voltage {1.7051, 1.6121} corresponding to the digital control value 0011 or a candidate reference voltage {1.73, 1.63} corresponding to the digital control value 0011 with a larger error, to respectively select the first reference voltage (such as 1.7051 or 1.73) and the second reference voltage (such as 1.6121 or 1.63) as the rising reference voltage VRR and the falling reference voltage VFR.

After the operations of the step 322, the step 312 can be entered, wherein the memory controller 110 can detect a new voltage-drop event and make a control corresponding to the new voltage-drop event.

According to the present embodiment, the another first reference voltage selected as the rising reference voltage VRR (such as the candidate reference voltage 1.6117 corresponding to the digital control value 0010 or the candidate reference corresponding to the digital control value 0010 with larger error Voltage 1.63) and the second reference voltage (such as the candidate reference voltage 1.6121 corresponding to the digital control value 0011 or the candidate reference voltage 1.63 corresponding to the digital control value 0011 with larger error) selected as the falling reference voltage VFR, can be close to each other or equal to each other. For example, the another first reference voltage selected as the rising reference voltage VRR can be a candidate reference voltage 1.6117 corresponding to the digital control value 0010, and the second reference voltage selected as the falling reference voltage VFR can be a candidate reference voltage 1.6121 corresponding to the digital control value 0011, wherein candidate reference voltages 1.6117 and 1.6121 are similar to each other. According to a preset specification of the reference voltage generation circuit VG(na), respective typical values (such as 1.6) of the two candidate reference voltages 1.6117 and 1.6121 can be equal to each other. In this way, the typical value of the another first reference voltage selected as the rising reference voltage VRR (such as the typical value 1.6 of the candidate reference voltage 1.6117) and the typical value of the second reference voltage selected as the falling reference voltage VFR (such as the typical value 1.6 of the candidate reference voltage 1.6121) can be equal to each other. In addition, according to the circuit design of the reference voltage generation circuit VG(na), the respective ideal values (such as 1.6, 1.61, or 1.612) of these two candidate reference voltages 1.6117 and 1.6121 can be equal to each other and their errors can fall within the reasonable error margin of the process, wherein the two candidate reference voltages can be considered equal to one another in the condition of ignoring the error. For another example, the another first reference voltage selected as the rising reference voltage VRR can be 1.63, which is a candidate reference voltage with a larger error corresponding to the digital control value 0010, and the second selected as the falling reference voltage VFR can be a candidate reference voltage of 1.63 corresponding to the digital control value 0011 with a larger error, wherein the two candidate reference voltages 1.63 and 1.63 are equal to each other. In this way, the another first reference voltage (such as the candidate reference voltage 1.63) selected as the rising reference voltage VRR and the second reference voltage (such as the candidate reference voltage 1.63) selected as the falling reference voltage VFR can be equal to each other.

According to the method of the present invention (such as the method 300), the memory controller 110 can prevent the error from causing the memory device 100 to crash when the error of the candidate reference voltage becomes larger.

Figure 4:
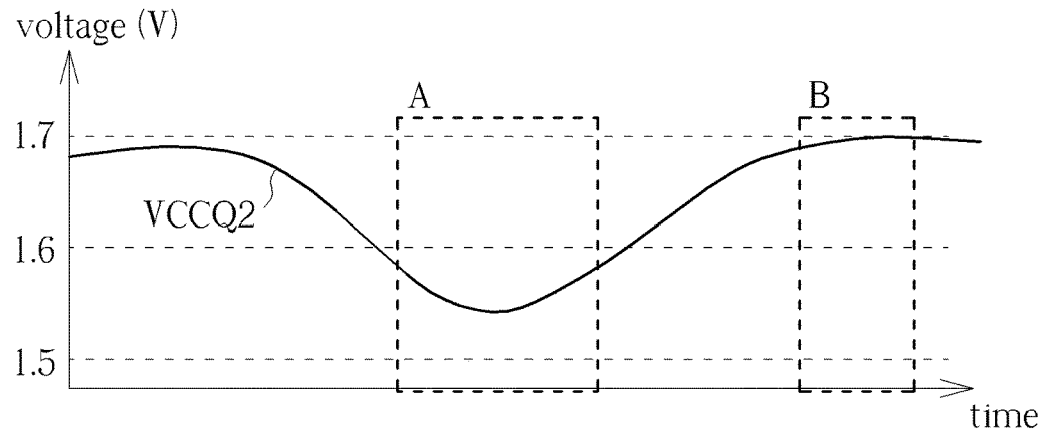
FIG. 4 shows the driving voltage VCCQ2 monitored by the method shown in FIG. 3 according to an embodiment.

FIG. 4 shows the driving voltage VCCQ2 monitored by the method 300 shown in FIG. 3 according to an embodiment, wherein the horizontal axis represents time, and the vertical axis represents voltage in units of volts. For ease of understanding, it is assumed that the typical value of the voltage level of the driving voltage VCCQ2 is 1.7 (V). According to the present embodiment, the configurable monitoring circuit VDT(na) can continuously monitor the driving voltage VCCQ2. For example, the voltage detector VD(na) can detect the voltage level of driving voltage VCCQ2 according to one or more latest reference voltages (such as one or more of the plurality of candidate reference voltages dynamically selected or determined by the dynamic mapping control module 212) generated by the reference voltage generation circuit VG(na). When there is a requirement (for example, before or after the memory controller 110 accesses the NV memory 120), the dynamic mapping control module 212 can check, and in particular, can obtain one or more latest detection results from the configurable monitoring circuit VDT(na), such as at least one detection result described in any one of the steps 314 and 320. In addition, different checking periods can result in different effects and/or behaviors, and the dynamic mapping control module 212 can flexibly control the operations of the memory device 100 to ensure the best performance of the memory device 100. For example, when a certain voltage-drop event of the driving voltage VCCQ2 occurs during the checking period A, the dynamic mapping control module 212 can cause the memory controller 110 to pause any access to the NV memory 120 and wait until the voltage-drop event ends (for example, the voltage level of the driving voltage VCCQ2 is restored to its typical value) and then triggers the NV memory 120 and the memory controller 110 to be re-initialized. For another example, if the processing circuit, such as the microprocessor 112, is busy during the check period A, the dynamic mapping control module 212 may not be able to check or process the voltage-drop event. During the checking period B, the dynamic mapping control module 212 can only trigger the re-initialization of the NV memory 120 and the memory controller 110 without waiting for voltage recovery.

Figure 5:
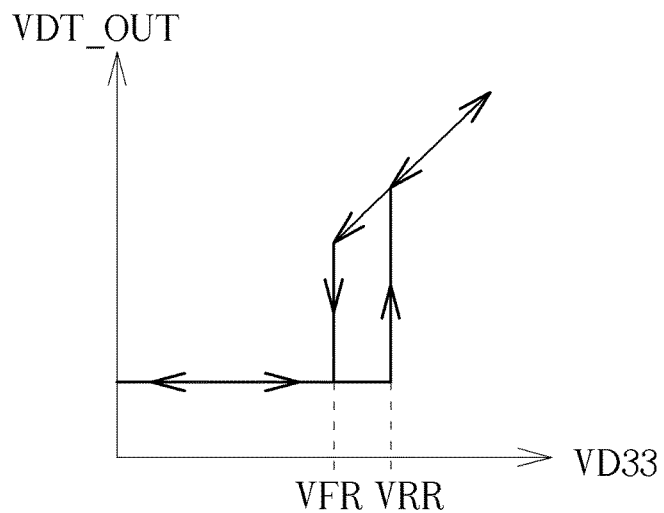
FIG. 5 shows a trigger and release control scheme of the method shown in FIG. 3 according to an embodiment.

FIG. 5 shows a trigger and release control scheme of the method 300 shown in FIG. 3 according to an embodiment. FIG. 5 can indicate the relationship between the state transition of the register flag VDT_OUT in the configurable monitoring circuit VDT(na) and the voltage level of the power signal VD33 (for example, the driving voltage). For ease of understanding, the horizontal and vertical axes are labeled "VD33" and "VDT_OUT", respectively. When the voltage level of the power signal VD33 suddenly drops and becomes less than the second reference voltage (such as 1.6121 or 1.63) selected as the falling reference voltage VFR, the register flag VDT_OUT can be (in the downward arrow in FIG. 5) to a lower value that represents a triggering state, wherein the second reference voltage selected as the falling reference voltage VFR can be considered as a triggering level. When the voltage level of the power signal VD33 rises and becomes greater than the another first reference voltage (such as 1.6117 or 1.63) selected as the rising reference voltage VRR, the register flag VDT_OUT can be (in the upward arrow in FIG. 5) to a higher value representing a releasing state, wherein the another first reference voltage selected as the rising reference voltage VRR can be considered as a releasing level. For example, the another first reference voltage selected as the rising reference voltage VRR can be approximately 0.1(V) larger than the second reference voltage obtained from the falling reference voltage VFR, but the present invention is not limited thereto. At least one of the Table 1 and the Table 2 (for example, the Table 1 and/or the Table 2) can be applicable to various conditions (such as the condition that the power signal VD33 is the driving voltage VCC and the condition that the power signal VD33 is the driving voltage VCCQ2), but the present invention is not limited to this.

According to some embodiments, memory device 100 and its multiple copies can be multiple electronic products of the same model. For the memory device 100 and the plurality of replicas, accuracy of any one of the plurality of candidate reference voltages can be less than accuracy of the driving voltage generated by the host device 50. In addition, the plurality of candidate reference voltages can be divided into two sets:

A first set of candidate reference voltages (for example, the candidate reference voltages {1.4002, 1.5117, . . . , 2.8903} in the Table 1 or the Table 2) that can be selected as the rising reference voltage VRR for voltage detection; and A second set of candidate reference voltages (for example, the candidate reference voltages {1.3055, 1.4190, . . . , 2.7964} in the Table 1 or the Table 2) that can be selected as the falling reference voltage VFR for voltage detection; wherein the voltage difference between any two adjacent voltages in any one of the two sets can be equal to a predetermined voltage difference.

TABLE 3

| Name | Difference | Change | Actual detecting value | Specification Min. value | Specification Typical value | Specification Max. value | Unit | Digital control value |
|---|---|---|---|---|---|---|---|---|
| VRR | 0.02 | 1.43% | 1.42 | | 1.4 | | V | 0000 |
| | 0.03 | 2.00% | 1.53 | | 1.5 | | V | 0001 |
| | 0.04 | 2.50% | 1.64 | | 1.6 | | V | 0010 |
| | 0.02 | 1.18% | 1.72 | | 1.7 | | V | 0011 |
| | 0.05 | 2.78% | 1.85 | | 1.8 | | V | 0100 |
| | 0.04 | 2.11% | 1.94 | | 1.9 | | V | 0101 |
| | 0.05 | 2.50% | 2.05 | | 2.0 | | V | 0110 |
| | 0.05 | 2.38% | 2.15 | | 2.1 | | V | 0111 |
| | 0.01 | 0.45% | 2.21 | | 2.2 | | V | 1000 |
| | −0.02 | −0.87% | 2.28 | | 2.3 | | V | 1001 |
| | −0.05 | −2.08% | 2.35 | | 2.4 | | V | 1010 |
| | −0.05 | −2.00% | 2.45 | | 2.5 | | V | 1011 |
| | −0.05 | −1.92% | 2.55 | | 2.6 | | V | 1100 |
| | −0.05 | −1.85% | 2.65 | | 2.7 | | V | 1101 |
| | −0.04 | −1.43% | 2.76 | | 2.8 | | V | 1110 |
| | −0.04 | −1.38% | 2.86 | | 2.9 | | V | 1111 |
| VFR | 0.01 | 0.77% | 1.31 | | 1.3 | | V | 0000 |
| | 0.03 | 2.14% | 1.43 | | 1.4 | | V | 0001 |
| | 0.04 | 2.67% | 1.54 | | 1.5 | | V | 0010 |
| | 0.03 | 1.87% | 1.63 | | 1.6 | | V | 0011 |
| | 0.05 | 2.94% | 1.75 | | 1.7 | | V | 0100 |
| | 0.04 | 2.22% | 1.84 | | 1.8 | | V | 0101 |
| | 0.05 | 2.63% | 1.95 | | 1.9 | | V | 0110 |
| | 0.18 | 9.00% | 2.18 | | 2.0 | | V | 0111 |
| | 0.22 | 10.48% | 2.32 | | 2.1 | | V | 1000 |
| | 0.19 | 8.64% | 2.39 | | 2.2 | | V | 1001 |
| | 0.15 | 6.52% | 2.45 | | 2.3 | | V | 1010 |
| | 0.16 | 6.67% | 2.56 | | 2.4 | | V | 1011 |
| | 0.16 | 6.40% | 2.66 | | 2.5 | | V | 1100 |
| | 0.16 | 6.15% | 2.76 | | 2.6 | | V | 1101 |
| | 0.16 | 5.93% | 2.86 | | 2.7 | | V | 1110 |
| | 0.17 | 6.07% | 2.97 | | 2.8 | | V | 1111 |

The Table 3 lists examples of related information of the first set of candidate reference voltages and the second set of candidate reference voltages in the upper and lower halves of the Table 3, respectively, such as their specifications (for example, the typical values, the maximum values, and the minimum values; for the sake of brevity, the contents of the latter two tables have been omitted), their units (such as volts, "V"), their control register settings (such as the digital control values), their actual detecting values, their changes (such as the errors represented by percentage), and their differences (for example, the difference value of the actual detecting value minus the typical value), wherein the typical values shown in the Table 3 can be obtained by rounding the candidate reference voltages {{1.4002, 1.5117, . . . , 2.8903}, {1.3055, 1.4190, . . . , 2.7964}} in the Table 1 or the Table 2, but the present invention is not limited thereto. The table contents of the Table 3 can be varied according to some embodiments. For example, the specifications can be varied. For another example, the actual detecting values and the corresponding errors and differences can be varied. According to some embodiments, the range of error can reach as much as [−3.3%, +3.3%] when considering various factors such as temperature changes, and the absolute value of the corresponding difference (such as the difference) can reach the half of the spacing 0.1 (V) of the typical values in the Table 3. For example, in the second set of candidate reference voltages, the actual detecting value of the candidate reference voltage 1.6121 (V) specified by the digital control value 0011 can fall within the interval [1.56, 1.66] (V) (which can be obtained according to the error range [−3.3%, +3.3%]). In an embodiment, the actual detecting value of the candidate reference voltage 1.6121 (V) can be 1.63 (V) for one of a plurality of electronic products of the same type as mentioned above.

Figure 6:
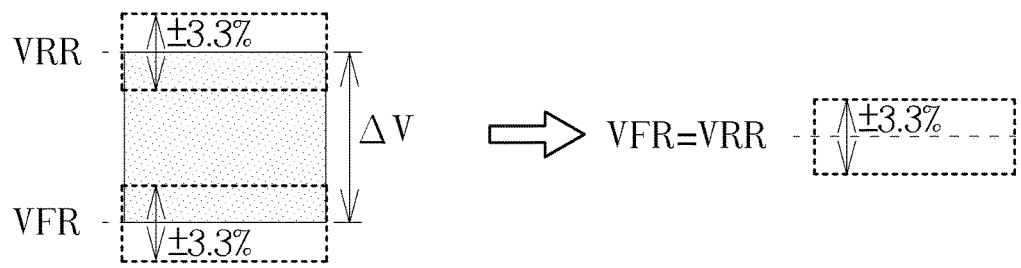
FIG. 6 shows an error-range shrinking control scheme of the method shown in FIG. 3 according to an embodiment.

FIG. 6 shows an error-range shrinking control scheme of the method 300 shown in FIG. 3 according to an embodiment. The left half of FIG. 6 can indicate that the rising reference voltage VRR (especially a certain reference voltage selected as the rising reference voltage VRR among the first set of candidate reference voltages, such as the another first reference voltage) and the falling reference voltage VFR of the second reference voltage (especially a certain reference voltage selected as the falling reference voltage VFR among the second set of candidate reference voltages, such as the second reference voltage), their respective error range [−3.3%, +3.3%] (or "±0.3%"), and the voltage difference ΔV between them, wherein the voltage difference ΔV can be equal to a predetermined voltage difference such as 0.1 V, but the invention is not limited thereto. For example, the reference voltage selected as the rising reference voltage VRR can reach 1.75 (V) (or higher) and after the occurrence of the voltage-drop event, the driving voltage returns to its typical value of 1.7 (V) and only has a slight voltage shift (for example, [1.7-0.01, 1.7+0.01]). In this situation, if the core logic 205 does not enable the dynamic mapping control module 212 in the reference voltage dynamic image architecture 210 and only depends on the voltage detection circuit 210VDT, the operation of the core logic 205 may be stuck (for example, a certain access operation is paused) so that the memory device 100 crashes. As shown in the right half of FIG. 6, the core logic 205 may enable the dynamic mapping control module 212 in the reference voltage dynamic mapping architecture 210 instead of relying solely on the voltage detection circuit 210VDT for dynamic mapping control, to make the two error ranges shown in the left half of FIG. 6 close to each other and make them approximately or completely overlapped. Thus, the entire range (such as [1.56, 1.76] (V)) occupied by these two error ranges can be shrunk, for example, to the range [1.56, 1.66] (V), but the present invention is not limited thereto. According to this error-range shrinking control scheme, the probability of the error of the voltage detection circuit 210VDT causing a crash can approach to zero.

Figure 7:
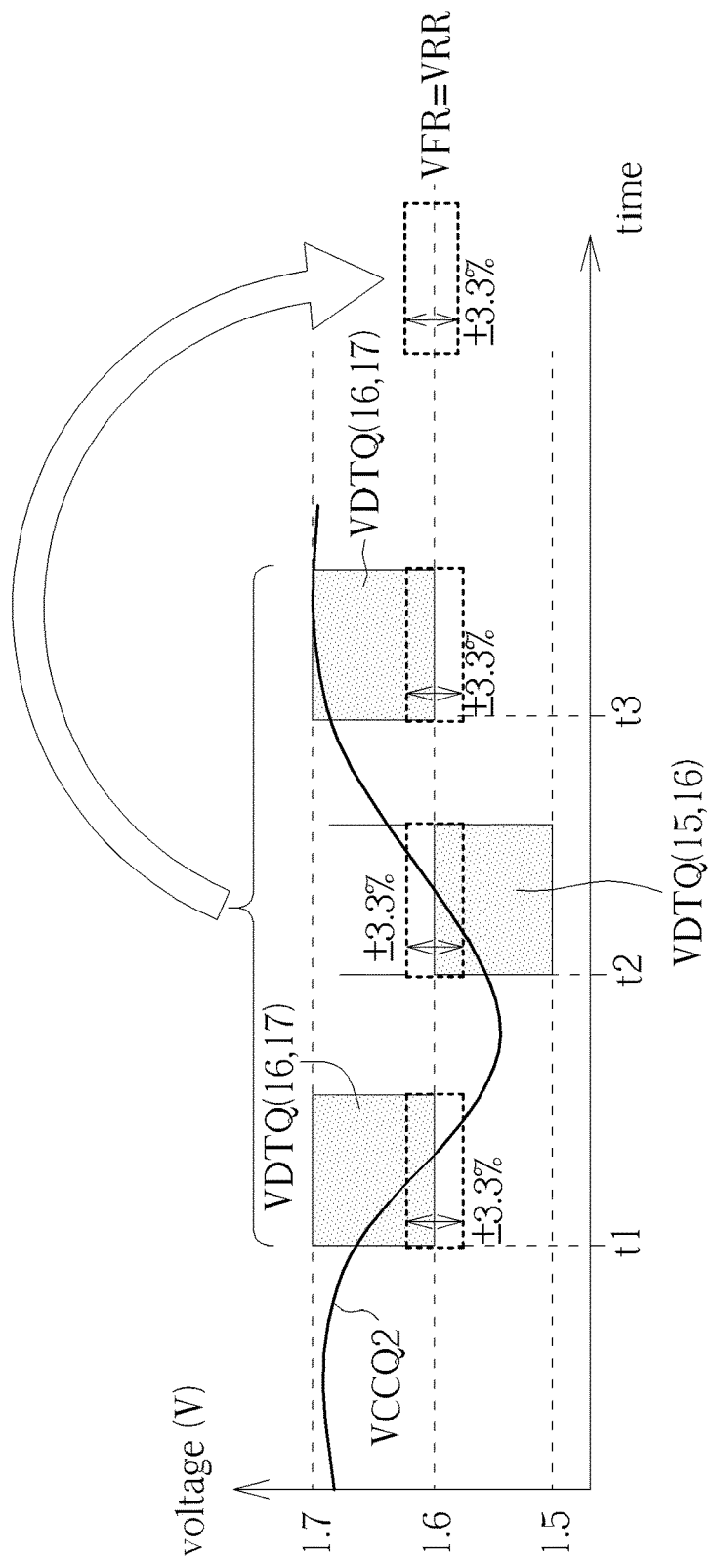
FIG. 7 illustrates the implementation details of the error range shrink control scheme shown in FIG. 6 according to an embodiment.

FIG. 7 illustrates the implementation details of the error-range shrinking control scheme shown in FIG. 6 according to an embodiment. The dynamic mapping control module 212 can detect accurately by dynamically changing the mapping relationship between the rising reference voltage VRR and the first group of candidate reference voltages and the mapping relationship between the falling reference voltage VFR and the second group of candidate reference voltages. The dynamic mapping control module 212 can accurately detect the driving voltage without being limited by the hardware error. At the time point t1, the dynamic mapping control module 212 can have completed the operation of step 310, for example, the (default) threshold setting VDTQ(16,17) has been completed: mapping the rising reference voltage VRR and the falling reference voltage VFR to the first reference voltage and the second reference voltage, such as the candidate reference voltages {1.7051, 1.6121} corresponding to the digital control value 0011. The voltage drop event occurs at a time point in the interval [t1, t2]. At the time point t2, the dynamic mapping control module 212 can perform the operation of step 316, for example, setting the threshold value VDTQ(15,16): mapping the rising reference voltage VRR and the falling reference voltage VFR to the another first reference voltage and the another second reference voltage, such as the candidate reference voltages {1.6117, 1.5195} corresponding to the digital control value 0010. At the time point in the interval [t2, t3], the voltage drop event ends. At the time point t3, the dynamic mapping control module 212 can perform the operation of step 322, for example, setting the threshold value setting VDTQ(16, 17): mapping the rising reference voltage VRR and the falling reference voltage VFR respectively to the first reference voltage and the second reference voltage, such as the candidate reference voltages {1.7051, 1.6121} corresponding to the digital control value 0011. By dynamically switching between threshold settings VDTQ(16, 17) and VDTQ(15, 16), the entire range (such as [1.56, 1.76] (V)) of the above two error ranges can be shrunk, as shown in the right side of FIG. 7.

Figure 8:
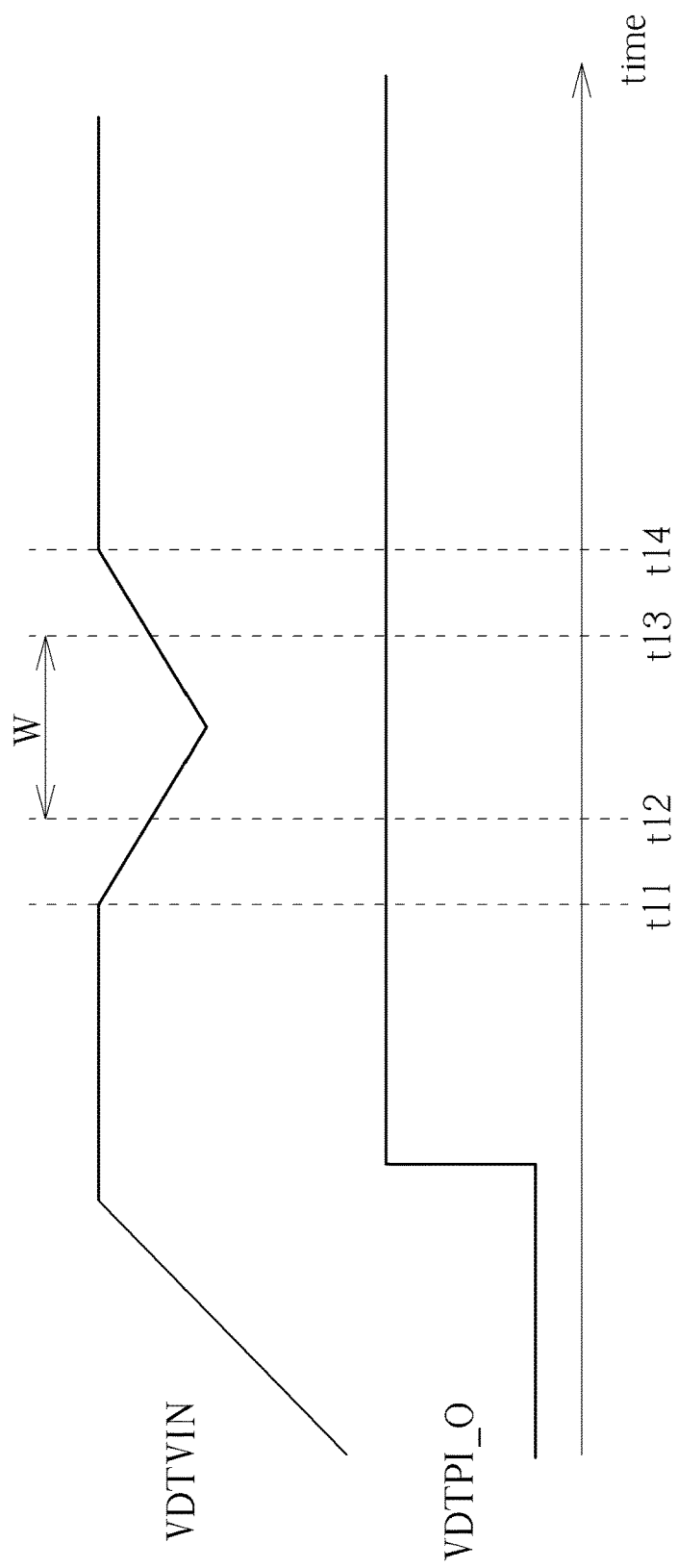
FIG. 8 illustrates the ignoring control scheme of the method shown in FIG. 3 according to an embodiment.

FIG. 8 illustrates the ignoring control scheme of the method 300 shown in FIG. 3 according to an embodiment. The signal VDTPI_O can be utilized as an example of the driving signal, and the signal VDTVIN can be utilized as an example of the output signal of the voltage detector VD(na), wherein the output signal can carry one or more detecting results of the voltage detectors VD(na), such as the detecting result mentioned in the step 314 or the step 320. The voltage detector VD(na) can comprise a filter to eliminate voltage-drops that are too short. When the time difference W between the two time points t12 and t13 that is half of the drop (decreasing value) in the voltage-drop does not exceed a predetermined time difference, such as 2.49 microseconds, the voltage detector VD(na) can use the filter to filter out the voltage-drop so that the signal VDTVIN remains unchanged, as shown by the waveform between time points t12 and t13; otherwise, the signal VDTVIN changes state to indicate the voltage-drop event. The signal VDTVIN can cause the flag on one of the registers in the core logic circuit 205 to be lifted up, but the present invention is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for controlling operations of a memory device, the memory device comprising a non-volatile (NV) memory, the NV memory comprising at least one NV memory element, the method comprising:

during a pre-voltage-drop period before a voltage-drop event regarding a driving voltage occurs, respectively setting a rising reference voltage and a falling reference voltage to be a first reference voltage and a second reference voltage generated by a reference voltage generating circuit in the memory device, wherein the memory device retrieves the driving voltage from a host device, the reference voltage generating circuit generates at least one portion of a plurality of candidate reference voltages, the at least one portion of the plurality of candidate reference voltages comprises the first reference voltage and the second reference voltage, and the first reference voltage is greater than the second reference voltage;

during the pre-voltage-drop period, using a voltage detector in the memory device to monitor the driving voltage according to the second reference voltage selected as the falling reference voltage, to determine whether the voltage-drop event occurs;

during a voltage-drop period for the voltage-drop event, pausing at least one access operation to the NV memory, and respectively setting the rising reference voltage and the falling reference voltage to be another first reference voltage and another second reference voltage generated by the reference voltage generating circuit, wherein the at least one portion of the plurality of candidate reference voltages comprises the another first reference voltage and the another second reference voltage, and the another first reference voltage is greater than the another second reference voltage;

during the voltage-drop period, using the voltage detector to monitor the driving voltage according to the another first reference voltage selected as the rising reference voltage, to determine whether the voltage-drop event ends; and during another pre-voltage-drop period before another voltage-drop event regarding the driving voltage occurs, respectively setting the rising reference voltage and the falling reference voltage to be the first reference voltage and the second reference voltage, wherein the another pre-voltage-drop period is entered after the voltage-drop event ends.

2. The method of claim 1, further comprising:

during the another pre-voltage-drop period, using the voltage detector in the memory device to monitor the driving voltage according to the second reference voltage selected as the falling reference voltage, to determine whether the another voltage-drop event occurs;

during another voltage-drop period for the another voltage-drop event, pausing at least one access operation to the NV memory, and respectively setting the rising reference voltage and the falling reference voltage to be the another first reference voltage and the another second reference voltage generated by the reference voltage generating circuit;

during the another voltage-drop period, using the voltage detector to monitor the driving voltage according to the another first reference voltage selected as the rising reference voltage, to determine whether the another voltage-drop event ends; and during yet another pre-voltage-drop period before yet another voltage-drop event regarding the driving voltage occurs, respectively setting the rising reference voltage and the falling reference voltage to be the first reference voltage and the second reference voltage, wherein the yet another pre-voltage-drop period is entered after the another voltage-drop event ends.

3. The method of claim 1, further comprising:

during the voltage-drop period, pausing any writing operations to the NV memory.

4. The method of claim 1, wherein the another first reference voltage selected as the rising reference voltage and the second reference voltage selected as the falling reference voltage are equal to each other.

5. The method of claim 1, wherein a plurality of memory devices comprising the memory device are a plurality of electronic products of the same model; and for the plurality of memory devices, accuracy of any reference voltage of the candidate reference voltages is less than accuracy of the driving voltage generated by the host device.

6. The method of claim 1, further comprising:

according to a first detection result of the voltage detector, determining that the voltage-drop event occurs, wherein the first detection result indicates that the driving voltage is less than the second reference voltage selected as the falling reference voltage; and according to a second detection result of the voltage detector, determining that the voltage-drop event ends, wherein the second detection result indicates that the driving voltage is greater than the another first reference voltage selected as the rising reference voltage.

7. A memory device, comprising:

a non-volatile (NV) memory, arranged to store information, wherein the NV memory comprises at least one NV memory element; and a controller, coupled to the NV memory, arranged to control at least one operations of the memory device, wherein the controller comprises:

a processing circuit, arranged to control the controller according to a command from a host device to allow the host device to access the NV memory through the controller, wherein under the control of the processing circuit, the controller performs the following operations:

during a pre-voltage-drop period before a voltage-drop event regarding a driving voltage occurs, respectively setting a rising reference voltage and a falling reference voltage to be a first reference voltage and a second reference voltage generated by a reference voltage generating circuit in the memory device, wherein the memory device retrieves the driving voltage from a host device, the reference voltage generating circuit generates at least one portion of a plurality of candidate reference voltages, the at least one portion of the plurality of candidate reference voltages comprises the first reference voltage and the second reference voltage, and the first reference voltage is greater than the second reference voltage;

during the pre-voltage-drop period, using a voltage detector in the memory device to monitor the driving voltage according to the second reference voltage selected as the falling reference voltage, to determine whether the voltage-drop event occurs;

during a voltage-drop period for the voltage-drop event, pausing at least one access operation to the NV memory, and respectively setting the rising reference voltage and the falling reference voltage to be another first reference voltage and another second reference voltage generated by the reference voltage generating circuit, wherein the at least one portion of the plurality of candidate reference voltages comprises the another first reference voltage and the another second reference voltage, and the another first reference voltage is greater than the another second reference voltage;

during the voltage-drop period, using the voltage detector to monitor the driving voltage according to the another first reference voltage selected as the rising reference voltage, to determine whether the voltage-drop event ends; and during another pre-voltage-drop period before another voltage-drop event regarding the driving voltage occurs, respectively setting the rising reference voltage and the falling reference voltage to be the first reference voltage and the second reference voltage, wherein the another pre-voltage-drop period is entered after the voltage-drop event ends.

8. The memory device of claim 7, wherein under the control of the processing circuit, the controller further performs the following operations:

during the another pre-voltage-drop period, using the voltage detector in the memory device to monitor the driving voltage according to the second reference voltage selected as the falling reference voltage, to determine whether the another voltage-drop event occurs;

during another voltage-drop period for the another voltage-drop event, pausing at least one access operation to the NV memory, and respectively setting the rising reference voltage and the falling reference voltage to be the another first reference voltage and the another second reference voltage generated by the reference voltage generating circuit;

during the another voltage-drop period, using the voltage detector to monitor the driving voltage according to the another first reference voltage selected as the rising reference voltage, to determine whether the another voltage-drop event ends; and during yet another pre-voltage-drop period before yet another voltage-drop event regarding the driving voltage occurs, respectively setting the rising reference voltage and the falling reference voltage to be the first reference voltage and the second reference voltage, wherein the yet another pre-voltage-drop period is entered after the another voltage-drop event ends.

9. The memory device of claim 7, wherein during the voltage-drop period, the controller pauses any writing operations to the NV memory.

10. The memory device of claim 7, wherein the another first reference voltage selected as the rising reference voltage and the second reference voltage selected as the falling reference voltage are equal to each other.

11. The memory device of claim 7, wherein a plurality of memory devices comprising the memory device are a plurality of electronic products of the same model; and for the plurality of memory devices, accuracy of any reference voltage of the candidate reference voltages is less than accuracy of the driving voltage generated by the host device.

12. The memory device of claim 7, wherein according to a first detection result of the voltage detector, the controller determines that the voltage-drop event occurs, wherein the first detection result indicates that the driving voltage is less than the second reference voltage selected as the falling reference voltage; and according to a second detection result of the voltage detector, the controller determines that the voltage-drop event ends, wherein the second detection result indicates that the driving voltage is greater than the another first reference voltage selected as the rising reference voltage.

13. An electronic device, comprising the memory device of claim 7, further comprising:
  the host device, coupled to the memory device, wherein the host device comprises:
    at least one processor, arranged to control the operations of the host device; and
    a power supply circuit, coupled to the at least one processor, arranged to provide power to the at least one processor and the memory device, and output the driving voltage to the memory device;
  wherein the memory device is arranged to provide storage space for the host device.

14. A controller of a memory device, the memory device comprising the controller and a non-volatile (NV) memory, the NV memory comprising at least one NV memory element, the controller comprising:
  a processing circuit, arranged to control the controller according to a command from a host device to allow the host device to access the NV memory through the controller, wherein under the control of the processing circuit, the controller performs the following operations:

during a pre-voltage-drop period before a voltage-drop event regarding a driving voltage occurs, respectively setting a rising reference voltage and a falling reference voltage to be a first reference voltage and a second reference voltage generated by a reference voltage generating circuit in the memory device, wherein the memory device retrieves the driving voltage from a host device, the reference voltage generating circuit generates at least one portion of a plurality of candidate reference voltages, the at least one portion of the plurality of candidate reference voltages comprises the first reference voltage and the second reference voltage, and the first reference voltage is greater than the second reference voltage;

during the pre-voltage-drop period, using a voltage detector in the memory device to monitor the driving voltage according to the second reference voltage selected as the falling reference voltage, to determine whether the voltage-drop event occurs;

during a voltage-drop period for the voltage-drop event, pausing at least one access operation to the NV memory, and respectively setting the rising reference voltage and the falling reference voltage to be another first reference voltage and another second reference voltage generated by the reference voltage generating circuit, wherein the at least one portion of the plurality of candidate reference voltages comprises the another first reference voltage and the another second reference voltage, and the another first reference voltage is greater than the another second reference voltage;

during the voltage-drop period, using the voltage detector to monitor the driving voltage according to the another first reference voltage selected as the rising reference voltage, to determine whether the voltage-drop event ends; and during another pre-voltage-drop period before another voltage-drop event regarding the driving voltage occurs, respectively setting the rising reference voltage and the falling reference voltage to be the first reference voltage and the second reference voltage, wherein the another pre-voltage-drop period is entered after the voltage-drop event ends.

15. The controller of claim 14, wherein under the control of the processing circuit, the controller further performs the following operations:
  during the another pre-voltage-drop period, using the voltage detector in the memory device to monitor the driving voltage according to the second reference voltage selected as the falling reference voltage, to determine whether the another voltage-drop event occurs;
  during another voltage-drop period for the another voltage-drop event, pausing at least one access operation to the NV memory, and respectively setting the rising reference voltage and the falling reference voltage to be the another first reference voltage and the another second reference voltage generated by the reference voltage generating circuit;
  during the another voltage-drop period, using the voltage detector to monitor the driving voltage according to the another first reference voltage selected as the rising reference voltage, to determine whether the another voltage-drop event ends; and
  during yet another pre-voltage-drop period before yet another voltage-drop event regarding the driving voltage occurs, respectively setting the rising reference voltage and the falling reference voltage to be the first reference voltage and the second reference voltage, wherein the yet another pre-voltage-drop period is entered after the another voltage-drop event ends.

16. The controller of claim 14, wherein during the voltage-drop period, the controller pauses any writing operations to the NV memory.

17. The controller of claim 14, wherein the another first reference voltage selected as the rising reference voltage and the second reference voltage selected as the falling reference voltage are equal to each other.

18. The controller of claim 14, wherein a plurality of memory devices comprising the memory device are a plurality of electronic products of the same model; and for the plurality of memory devices, accuracy of any reference voltage of the candidate reference voltages is less than accuracy of the driving voltage generated by the host device.

19. The controller of claim 14, wherein according to a first detection result of the voltage detector, the controller determines that the voltage-drop event occurs, wherein the first detection result indicates that the driving voltage is less than the second reference voltage selected as the falling reference voltage; and according to a second detection result of the voltage detector, the controller determines that the voltage-drop event ends, wherein the second detection result indicates that the driving voltage is greater than the another first reference voltage selected as the rising reference voltage.

* * * * *